(12) United States Patent
Disney et al.

(10) Patent No.: US 9,171,751 B2
(45) Date of Patent: Oct. 27, 2015

(54) METHOD AND SYSTEM FOR FABRICATING FLOATING GUARD RINGS IN GAN MATERIALS

(71) Applicant: AVOGY, INC., San Jose, CA (US)

(72) Inventors: Donald R. Disney, Cupertino, CA (US); Andrew P. Edwards, San Jose, CA (US); Hui Nie, Cupertino, CA (US); Richard J. Brown, Los Gatos, CA (US); Isik C. Kizilyalli, San Francisco, CA (US); David P. Bour, Cupertino, CA (US); Linda Romano, Sunnyvale, CA (US); Thomas R. Prunty, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/264,998

(22) Filed: Apr. 29, 2014

(65) Prior Publication Data

US 2014/0235030 A1    Aug. 21, 2014

Related U.S. Application Data

(62) Division of application No. 13/299,254, filed on Nov. 17, 2011, now Pat. No. 8,749,015.

(51) Int. Cl.
*H01L 29/06* (2006.01)
*H01L 21/761* (2006.01)
(Continued)

(52) U.S. Cl.
CPC .......... *H01L 21/761* (2013.01); *H01L 21/266* (2013.01); *H01L 21/2654* (2013.01); *H01L 29/0619* (2013.01); *H01L 29/0642* (2013.01); *H01L 29/0692* (2013.01); *H01L 29/2003* (2013.01); *H01L 29/402* (2013.01); *H01L 29/6631* (2013.01); *H01L 29/66136* (2013.01); *H01L 29/66212* (2013.01);
(Continued)

(58) Field of Classification Search
USPC .......... 257/471, 475, 485, E51.009; 438/167, 438/418, 478, 495
See application file for complete search history.

(56) References Cited

U.S. PATENT DOCUMENTS

| | | |
|---|---|---|
| 3,149,395 A | 9/1964 | Bray et al. |
| 4,982,260 A | 1/1991 | Chang et al. |

(Continued)

OTHER PUBLICATIONS

International Search Report and Written Opinion from PCT/US2012/062717 mailed on Jan. 8, 2013, 11 pages.
(Continued)

*Primary Examiner* — Thomas L Dickey
(74) *Attorney, Agent, or Firm* — Kilpatrick Townsend & Stockton LLP

(57) ABSTRACT

A method for fabricating an edge termination structure includes providing a substrate having a first surface and a second surface and a first conductivity type, forming a first GaN epitaxial layer of the first conductivity type coupled to the first surface of the substrate, and forming a second GaN epitaxial layer of a second conductivity type opposite to the first conductivity type. The second GaN epitaxial layer is coupled to the first GaN epitaxial layer. The method also includes implanting ions into a first region of the second GaN epitaxial layer to electrically isolate a second region of the second GaN epitaxial layer from a third region of the second GaN epitaxial layer. The method further includes forming an active device coupled to the second region of the second GaN epitaxial layer and forming the edge termination structure coupled to the third region of the second GaN epitaxial layer.

17 Claims, 17 Drawing Sheets

(51) Int. Cl.
*H01L 21/266* (2006.01)
*H01L 21/265* (2006.01)
*H01L 29/20* (2006.01)
*H01L 29/40* (2006.01)
*H01L 29/66* (2006.01)
*H01L 29/808* (2006.01)
*H01L 29/872* (2006.01)

(52) U.S. Cl.
CPC ..... *H01L 29/66909* (2013.01); *H01L 29/8083* (2013.01); *H01L 29/872* (2013.01)

(56) References Cited

U.S. PATENT DOCUMENTS

| | | | |
|---|---|---|---|
| 5,967,795 A * | 10/1999 | Bakowsky et al. | 438/494 |
| 6,325,850 B1 | 12/2001 | Beaumont et al. | |
| 6,844,251 B2 | 1/2005 | Shenai et al. | |
| 2002/0094667 A1 | 7/2002 | Bakowski et al. | |
| 2002/0117681 A1 | 8/2002 | Weeks et al. | |
| 2006/0011924 A1 | 1/2006 | Mazzola et al. | |
| 2006/0118900 A1 | 6/2006 | Zeghbroeck | |
| 2006/0220072 A1 | 10/2006 | Harris et al. | |
| 2007/0029573 A1 | 2/2007 | Cheng et al. | |
| 2007/0187715 A1 | 8/2007 | Zhao | |
| 2008/0251793 A1 * | 10/2008 | Mazzola et al. | 257/77 |
| 2009/0134405 A1 | 5/2009 | Ota et al. | |
| 2009/0206913 A1 | 8/2009 | Zeng et al. | |
| 2009/0289262 A1 | 11/2009 | Zhang et al. | |
| 2010/0176371 A1 | 7/2010 | Lochtefeld | |
| 2011/0031522 A1 | 2/2011 | Oya et al. | |
| 2013/0032811 A1 | 2/2013 | Kizilyalli et al. | |
| 2013/0087835 A1 | 4/2013 | Edwards et al. | |

OTHER PUBLICATIONS

Large-band-gap SiC, III-V nitride, and II-VI ZnSe-based semiconductor device technologies, Morkoc, H. et al., Aug. 1, 1994, J. Appl. Phys., vol. 76(3), pp. 1363-1398.

ISR/WO mailed on Dec. 7, 2012 for International Patent Application No. PCT/US2012/059250 filed on Oct. 8, 2012, all pages.

* cited by examiner

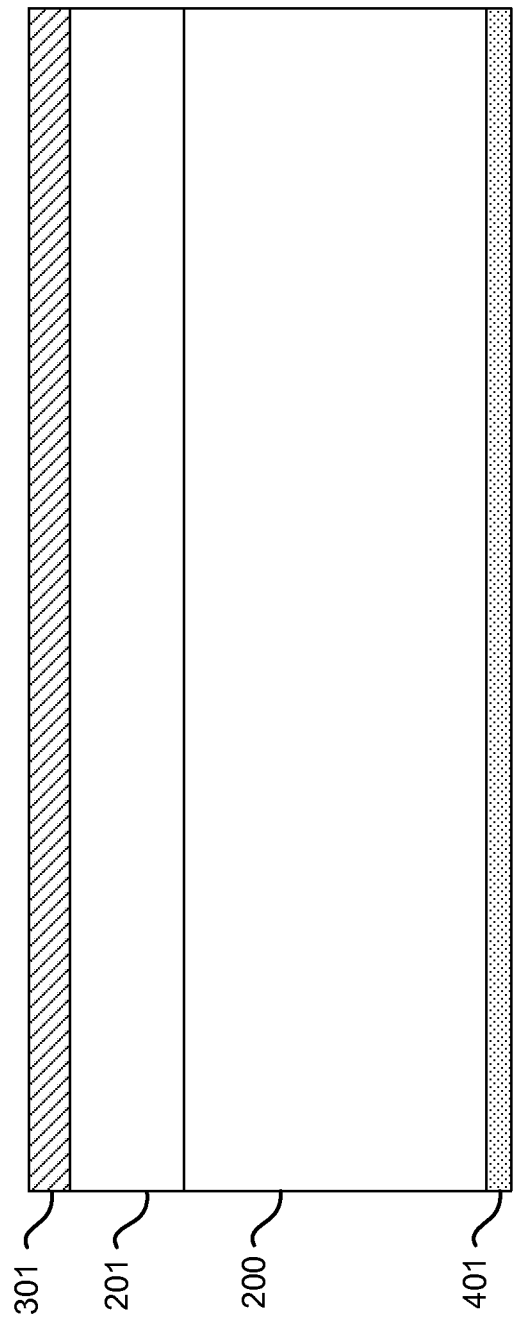

METHOD AND SYSTEM FOR FABRICATING FLOATING GUARD RINGS IN GAN MATERIALS

CROSS REFERENCE TO RELATED APPLICATIONS

This application is a divisional of U.S. patent application Ser. No. 13/299,254, filed Nov. 17, 2011, which is incorporated by reference herein for all purposes.

BACKGROUND OF THE INVENTION

Power electronics are widely used in a variety of applications. Power semiconductor devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same. Vertical power devices, in which the primary current flows from the top surface vertically down through the substrate, are often used in applications that require high voltage and/or current levels.

SUMMARY OF THE INVENTION

The present invention relates generally to electronic devices. More specifically, the present invention relates to forming edge termination structures using implantation processes in III-nitride semiconductor materials. Merely by way of example, the invention has been applied to methods and systems for manufacturing guard rings for semiconductor devices using ion implantation into gallium-nitride (GaN) based epitaxial layers to electrically isolate device regions from edge termination regions. The methods and techniques can be applied to a variety of power semiconductor devices such as Schottky diodes, PN diodes, vertical junction field-effect transistors (JFETs), thyristors, bipolar transistors, and other devices.

According to an embodiment of the present invention, a method for fabricating an edge termination structure is provided. The method, which can be used in conjunction with GaN-based materials, includes providing a substrate of a first conductivity type. The substrate has a first surface and a second surface. The method also includes forming a first GaN epitaxial layer of the first conductivity type coupled to the first surface of the substrate and forming a second GaN epitaxial layer of a second conductivity type opposite to the first conductivity type. The second GaN epitaxial layer is coupled to the first GaN epitaxial layer. The substrate, the first GaN epitaxial layer and the second GaN epitaxial layer can be referred to as an epitaxial structure. The method further includes implanting ions into a first region of the second GaN epitaxial layer to electrically isolate a second region of the second GaN epitaxial layer from a third region of the second GaN epitaxial layer, forming an active device coupled to the second region of the second GaN epitaxial layer, and forming the edge termination structure coupled to the third region of the second GaN epitaxial layer.

According to another embodiment of the present invention, a method of fabricating a structure is provided. The method includes forming an epitaxial structure by providing a III-nitride substrate of a first conductivity type characterized by a first dopant concentration, forming a first III-nitride epitaxial layer of the first conductivity type coupled to a first surface of the III-nitride substrate; and forming a second III-nitride epitaxial layer of a second conductivity type coupled to the first III-nitride epitaxial layer. The second III-nitride epitaxial layer has a surface opposing the first III-nitride epitaxial layer. The method also includes defining regions of the epitaxial structure by implanting ions into the surface of the second epitaxial layer to form an implantation region of the epitaxial structure. The implantation region electrically isolates a device region of the epitaxial structure from an edge termination region of the epitaxial structure. The method further includes forming one or more active devices using at least the device region of the epitaxial structure and forming an edge termination structure using at least the edge termination region of the epitaxial structure.

According to a specific embodiment of the present invention, a semiconductor structure is provided. The semiconductor structure includes a GaN substrate having a first surface and a second surface opposing the first surface. The GaN substrate is characterized by a first conductivity type and a first dopant concentration. The semiconductor structure also includes a first GaN epitaxial layer of the first conductivity type coupled to the second surface of the GaN substrate. The semiconductor structure further includes a second GaN epitaxial layer of a second conductivity type coupled to the first GaN epitaxial layer. The second GaN epitaxial layer includes an active device region, an edge termination region, and an implantation region disposed between the active device region and the edge termination region.

Numerous benefits are achieved by way of the present invention over conventional techniques. For example, embodiments of the present invention provide a high degree of electrical isolation between a device region and an edge termination region. In contrast to etched isolation techniques (e.g. etching through at least a portion of one or more epitaxial layers) the present invention provides final structures that are fully planar, that do not have any etched sidewalls (which can be a source of off-state leakage current), and that are less expensive to manufacture. These and other embodiments of the invention, along with many of its advantages and features, are described in more detail in conjunction with the text below and attached figures.

Figure 1A:
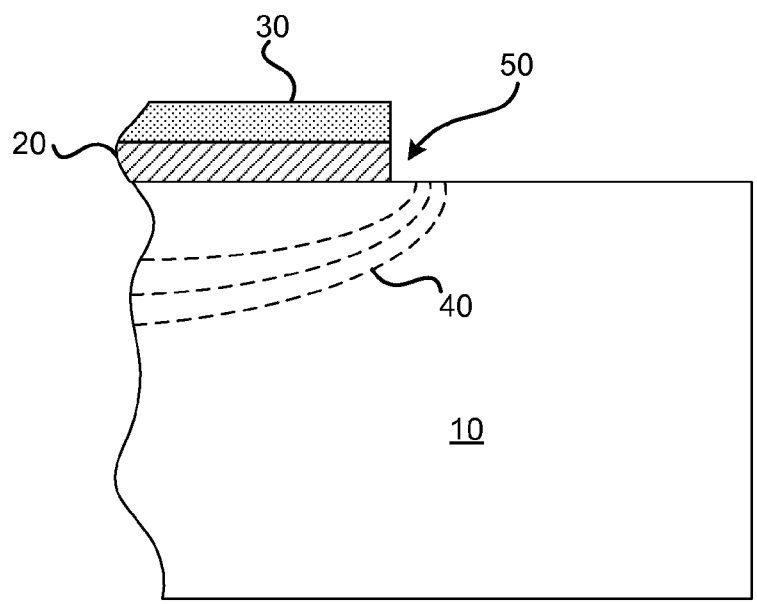
FIGS. 1A-1B are simplified cross-sectional diagrams of a portion of a semiconductor device, illustrating how edge termination structures improve the semiconductor device's performance, according to an embodiment of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention relate to electronic devices. More specifically, the present invention relates to forming edge termination structures, such as floating guard rings, to provide edge termination for semiconductor devices. Merely by way of example, the invention has been applied to methods and systems for manufacturing edge termination structures using ion implantation into gallium-nitride (GaN) based epitaxial layers. The methods and techniques can be applied to form a variety of types of edge termination structures that can provide edge termination to numerous types of semiconductor devices, including, but not limited to, junction field-effect transistors (JFETs), diodes, thyristors, vertical field-effect transistors, thyristors, and other devices, including merged PN, Schottky diodes such as those discussed in U.S. patent application Ser. No. 13/270,606, filed on Oct. 11, 2011, the disclosure of which is hereby incorporated by reference in its entirety.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$ is higher than competing materials for a given background doping level, N. This provides low resistivity, $\rho$, because resistivity is inversely proportional to electron mobility, as provided by equation (1): where q is the elementary charge.

$$\rho = \frac{1}{q\mu N}, \quad (1)$$

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

As described herein, semiconductor devices utilizing edge termination structures are able to exploit the high critical electric field provided by GaN and related alloys and heterostructures. Edge termination techniques such as field plates and guard rings provide proper edge termination by alleviating high fields at the edge of the semiconductor device. When properly employed, edge termination allows a semiconductor device to break down uniformly at its main junction rather than uncontrollably at its edge. According to some embodiments of the present invention, the portion of the semiconductor device used to conduct current in the on-state is referred to as an active device, an active region, or an active device region, to differentiate this region or portion of the device from the edge termination region, which typically does not contribute to forward conduction. Examples of active devices described herein include Schottky diodes, PN diodes, PIN diodes, JFETs, and the like. Within the scope of this invention, the edge termination structures and methods described here may be combined with many other types of active devices fabricated in GaN substrates, including but not limited to MOSFETs, MESFETs, PN diodes, and the like.

According to embodiments of the present invention, gallium nitride (GaN) epitaxy on pseudo-bulk GaN substrates is utilized to fabricate edge termination structures and/or semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

Figure 1B:
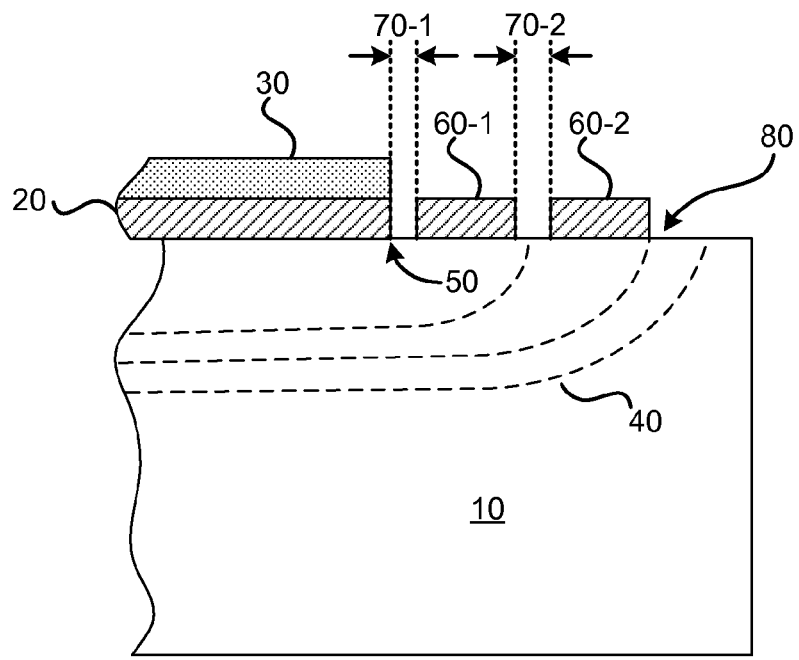

FIGS. 1A-1B are simplified cross-sectional diagrams of a portion of a semiconductor device, according to one embodiment, illustrating how the edge termination structures provided herein can be used to improve the semiconductor device's performance using edge termination.

FIG. 1A illustrates a diode structure where a p-n junction is created between a p-type semiconductor layer 20 formed on an n-type semiconductor substrate 10, which can be an epitaxial layer. In this example, a metal layer 30 is also formed on the p-type semiconductor layer 20 to provide electrical connectivity to the diode. Layer 30 may or may not share the same edge as layer 20 in FIG. 1A and FIG. 1B.

Because the diode of FIG. 1A has no termination structures, its performance is reduced. The electric field 40 (represented in FIG. 1A as potential lines), is crowded near the edge 50 of the diode, causing breakdown at a voltage that can be much less than the parallel plane breakdown voltage for the diode. This phenomenon can be especially detrimental to the operation of high-voltage semiconductor devices.

FIG. 1B illustrates how edge termination structures 60 can be used to alleviate field crowding near the edge 50 of the diode. The edge termination structures 60, which can be made of the same p-type semiconductor material as the p-type semiconductor layer 20 of the diode, are placed near the diode and given voltages such that the electric field 40 extends laterally beyond the edge 50 of the diode. By extending the potential drop and reducing the electric field in this manner, the edge termination structures 60 help enable the diode to operate at a breakdown voltage much closer to its parallel plane breakdown voltage.

The number of edge termination structures 60 can vary. In some embodiments, a single edge termination structure may be sufficient. In other embodiments, at least three termination structures can be used. The number of termination structures also can impact voltages at which each termination structure is biased. For example, the voltage for each termination structure can be decreased with each successive termination structure such that the termination structure farthest from the semiconductor device has the lowest voltage. For example, if the p-type semiconductor layer 20 is biased 600V below the potential of substrate 10, the edge termination structures 60-1 and 60-2 can float to 400V and 200V, respectively, below substrate 10. Of course, voltages can vary, depending on the physical dimensions and configuration of the semiconductor device and edge termination structures 60. However, ensuring that the potential difference between substrate 10 and the outermost edge termination structure 60-2 is sufficiently low, such that the electric field at its edge is lower than the peak field at the semiconductor's main junction, can help ensure the semiconductor device operates at or near its parallel plane breakdown voltage.

The spaces 70 between edge termination structures 60 can vary. According to some embodiments, width of the spaces 70 between edge termination structures 60 can increase as the distance from the semiconductor structure increases. For example, as shown in the embodiment of FIG. 1B, the width of a first space 70-1 between the first edge termination structure 60-1 and the semiconductor structure can be smaller than the second space 70-2 between the second edge termination structure 60-2 and the first edge termination structure 60-1. The width of the spaces 70 can vary depending on application. According one embodiment, the width of edge termination structures 60, ranging from 1 μm to 5 μm, can be approximately the same for all edge termination structures 60. In one embodiment, the width of spaces 70 between edge termination structures 60 may be substantially the same for all spaces, this uniform space being in the range of 0.3 μm to 5 μm. In another embodiment, the width of spaces 70 may increase with increased distance from the semiconductor device, ranging anywhere from 0.3 μm to 6 μm. In other embodiments, other spacings are utilized as appropriate to the particular application.

Figure 2:
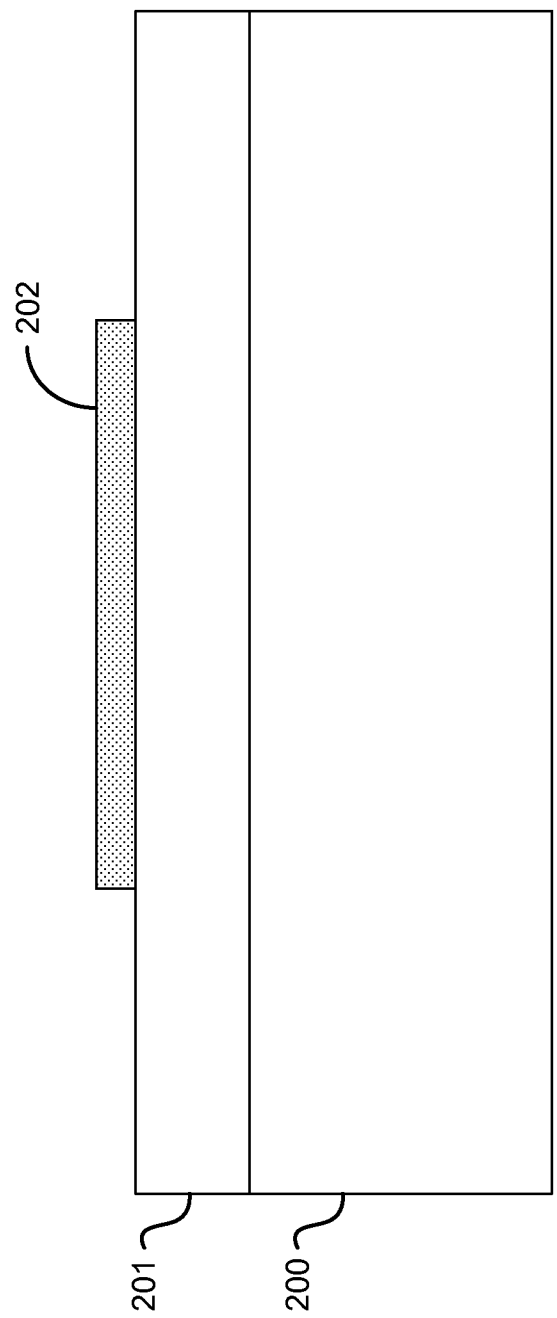
FIGS. 2-7 are simplified cross-sectional diagrams illustrating the fabrication of a Schottky diode in gallium-nitride with edge termination structures formed through ion implantation into an epitaxial layer according to an embodiment of the present invention.

FIGS. 2-7 illustrate a process for creating a Schottky diode in GaN with edge termination structures formed using ion implantation to isolate different regions of an epitaxial layer from each other. Referring to FIG. 2, a first GaN epitaxial layer 201 is formed on a GaN substrate 200 having the same conductivity type. As indicated above, the GaN substrate 200 can be a pseudo-bulk or bulk GaN material on which the first GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift region for the Schottky diode, and therefore can be a relatively low-doped material. For example, the first GaN epitaxial layer 201 can have an n-conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 μm and 100 μm, for example. In other embodiments thicknesses are greater than 5 μm. Resulting parallel plane breakdown voltages for the Schottky diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

FIG. 2 also illustrates the formation of a regrowth mask 202. In one embodiment, regrowth mask 202 is formed by growing or depositing a layer of material that inhibits the growth of GaN material during the epitaxial regrowth process. This material may be, for example, silicon dioxide, silicon nitride, or another suitable material. The regrowth mask material is patterned in the illustrated embodiment by using photolithography and etching techniques such that the regrowth mask 202 covers at least a portion of the active area of the device (e.g., the Schottky contact area for a Schottky diode device) but the regrowth mask does not cover the edge termination area. The active region and edge termination region, as described below, are not limited to the definition provided by the regrowth mask 202 in some embodiments of the present invention.

Different dopants can be used to create n- and p-type GaN epitaxial layers and structures disclosed herein. For example, n-type dopants can include silicon, oxygen, selenium, tellurium, or the like. P-type dopants can include magnesium, beryllium, calcium zinc, or the like.

Figure 3:
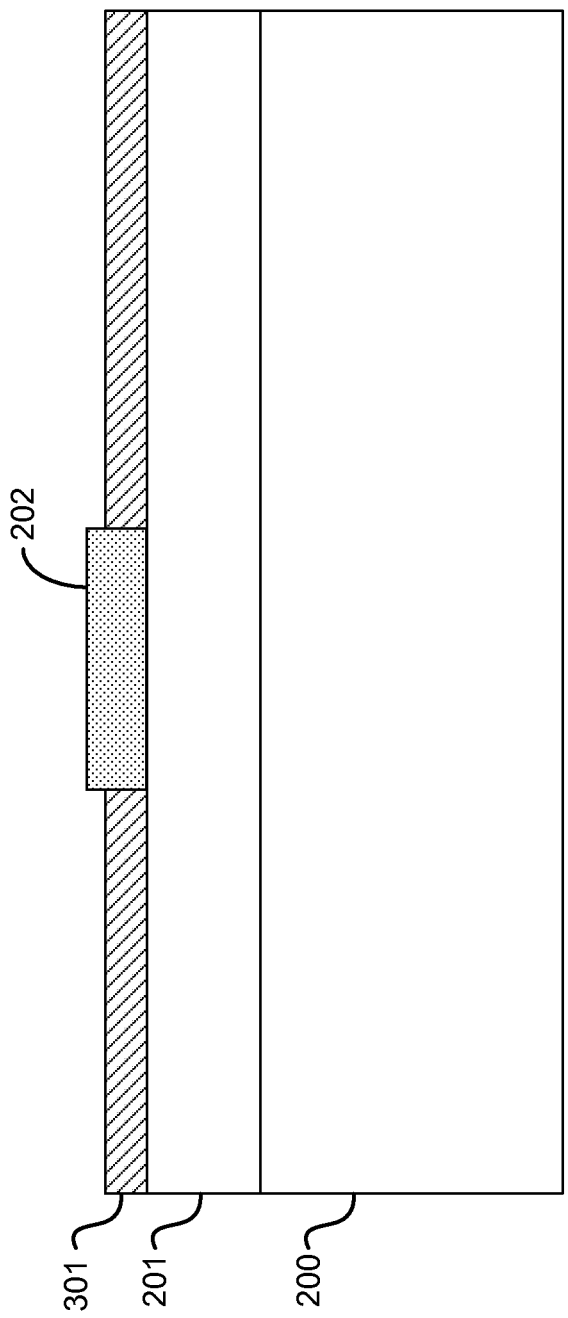

FIG. 3 illustrates the formation of a second GaN epitaxial layer 301 above the first GaN epitaxial layer 201. The second GaN epitaxial layer 301, from which portions or all of the edge termination structures are eventually formed, may have a conductivity type opposite the conductivity type of the first GaN epitaxial layer 201. For instance, if the first GaN epitaxial layer 201 is formed from an n-type GaN material, the second GaN epitaxial layer 301 will be formed from a p-type GaN material, and vice versa. The second GaN epitaxial layer 301 used to form elements of the edge termination structures is grown over portions of the first GaN epitaxial layer 201 that are not covered by regrowth mask 202. Second GaN epitaxial layer 301 is not formed over portions of first GaN epitaxial layer 201 that are covered by regrowth mask 202. This technique is referred to herein as selective epitaxial growth.

The thickness of the second GaN epitaxial layer 301 can vary, depending on the process used to form the layer and the device design. In some embodiments, the thickness of the second GaN epitaxial layer 301 is between 0.1 μm and 5 μm. In other embodiments, the thickness of the second GaN epitaxial layer 301 is between 0.3 μm and 1 μm.

The second GaN epitaxial layer 301 can be highly doped, for example in a range from about $5\times10^{17}$ cm$^{-3}$ to about $1\times10^{19}$ cm$^{-3}$. Additionally, as with other epitaxial layers, the dopant concentration of the second GaN epitaxial layer 301 can be uniform or non-uniform as a function of thickness. In some embodiments, the dopant concentration increases with thickness, such that the dopant concentration is relatively low near the first GaN epitaxial layer 201 and increases as the distance from the first GaN epitaxial layer 201 increases. Such embodiments provide higher dopant concentrations at the top of the second GaN epitaxial layer 301 where metal contacts can be subsequently formed. Other embodiments utilize heavily doped contact layers (not shown) to form Ohmic contacts.

One method of forming the second GaN epitaxial layer 301, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 4:
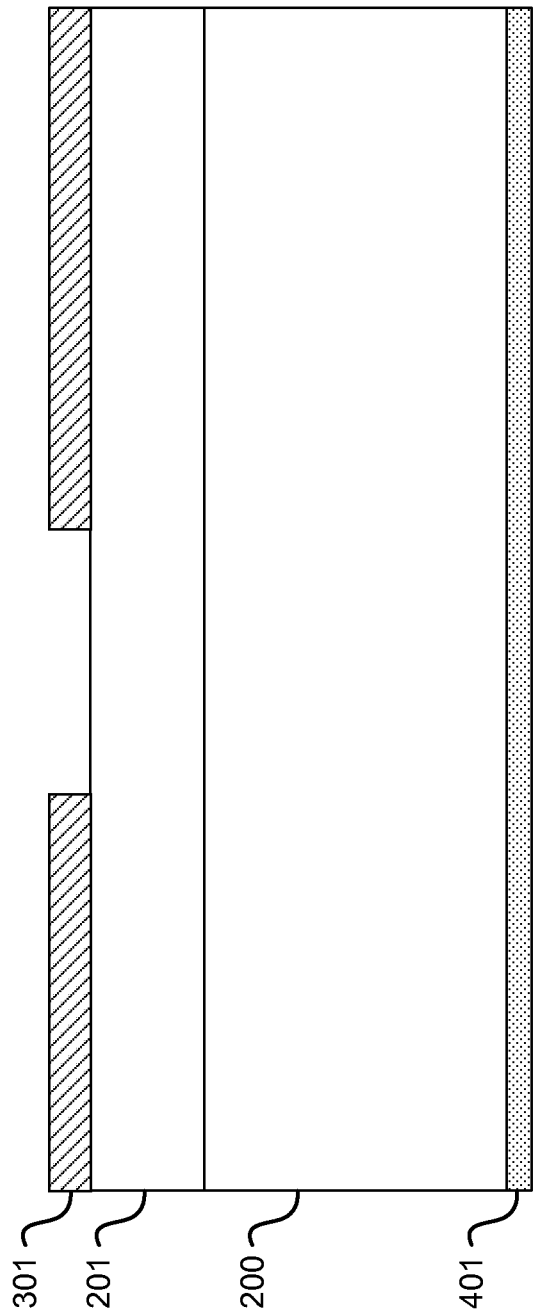

FIG. 4 illustrates the formation of a first metallic structure 401 below the GaN substrate 200. The first metallic structure 401 can be one or more layers of Ohmic metal that serve as an Ohmic contact for the cathode of the Schottky diode. For example, the metallic structure 401 can comprise a titanium-aluminum (Ti/Al) metal. Other metals and/or alloys can be used including, but not limited to, aluminum, nickel, gold, combinations thereof, or the like. In some embodiments, an outermost metal of the metallic structure 401 can include gold, tantalum, tungsten, palladium, silver, tin, aluminum, combinations thereof, and the like. The first metallic structure 401 can be formed using any of a variety of methods such as sputtering, evaporation, or the like. After first metallic structure 401 is formed, an optional heat treatment may be performed to improve the characteristics of the metal and/or the contact between the metal and the GaN substrate 200. For example, a rapid thermal anneal may be performed with a temperature in the range of 300° C. to 900° C. for a duration of one to ten minutes. In some embodiments, the ambient environment during the Rapid Thermal Anneal (RTA) may include nitrogen, hydrogen, oxygen, or a combination of these gases.

FIG. 4 further illustrates the removal of regrowth mask 202. In one embodiment, this layer is removed by wet etching or dry etching using one or more processing techniques. In some embodiments, the removal process is selected so that the underlying GaN surface is not substantially degraded by the removal process, such that the quality of the underlying material is not significantly compromised. For example, if regrowth mask 202 comprises silicon dioxide or silicon nitride, it may be removed by wet etching in a solution of hydrofluoric acid.

Figure 5:
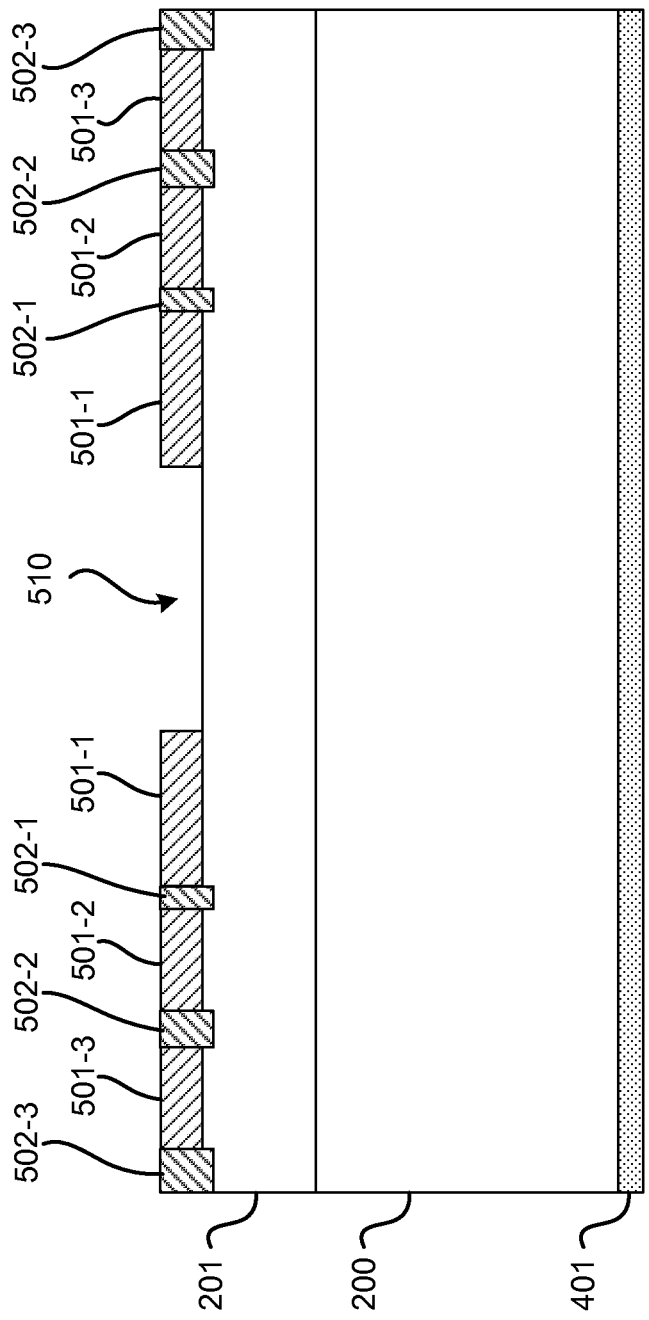

FIG. 5 is a simplified cross-sectional diagram illustrating ion implantation into a portion of the second GaN epitaxial layer 301 to form electrically isolated regions 501-1, 501-2, and 501-3, some or all of which can be utilized in fabricating edge termination structures (also referred to as edge termination elements). As discussed in further detail below, electrically isolated regions 501 can be used to form edge termination structures including any of a variety of structures, such as guard rings that circumscribe the active device (e.g., a Schottky diode) to provide edge termination. Additionally, as illustrated in FIG. 5, a portion of the second GaN epitaxial layer 301 is not formed adjacent a portion of the first GaN epitaxial layer (due to selective epitaxial growth as discussed above), such that there is an exposed portion 510 of the first GaN epitaxial layer 201 in which the Schottky diode or other active elements can subsequently be formed. The ion implantation is performed through mask openings formed in a layer of photoresist, silicon dioxide, or other suitable masking materials.

Embodiments of the present invention provide a plurality of regions that are electrically isolated from each other, for example, a device region between implanted regions 502-1 and including the electrically isolated regions 501-1 and the exposed portion 510. This device region is suitable for use in the fabrication of active devices as described herein since a current path is provided through the epitaxial structure disposed below the exposed portion 510. In addition to the device region, other regions that are electrically isolated from each other, including electrically isolated regions 501-2 and 501-3 are illustrated and suitable for use in fabricating edge termination structures compatible with the active devices fabricated in the device region. In some embodiments, the edge termination structures may include elements in both the device region (e.g., electrically isolated regions 501-1) as well as elements in the region including electrically isolated regions 501-2 and 501-3. One of ordinary skill in the art would recognize many variations, modifications, and alternatives.

The ion implantation process illustrated in FIG. 5 is designed to dramatically reduce the conductivity of the implanted regions 502-1, 502-2, and 502-3, effectively making these implanted regions electrically insulating. These electrically insulating implanted regions 502 electrically isolate portions or regions of the second GaN epitaxial layer 301 from other portions or regions of this layer, for example, 501-1 from 501-2 and 501-2 from 501-3. The implanted ion species may be argon, nitrogen, helium, hydrogen or other appropriate species that produce electrically insulating implanted regions 502. Multiple implantations may be performed through the same mask opening, each implant being performed at a different energy, such that the implanted profiles extend deeper vertically, without a need to diffuse the dopants using a high temperature drive-in process. Thus, although the implanted regions are illustrated as a homogeneous material in FIG. 5, this is not required by the present invention and the implant dose can vary as a function of the thickness of the second GaN epitaxial layer as well as in the plane of the layer.

In one embodiment, three nitrogen implantations may be performed with first, second, and third implantation energies of about 20 to 60 keV, about 100 to 200 keV, and about 300 to 500 keV, respectively. These nitrogen implant doses may be in the range of $5\times10^{12}$ to $1\times10^{16}$ cm$^{-2}$. In another embodiment, argon may be implanted with doses in the range of $1\times10^{12}$ to $5\times10^{16}$ cm$^{-2}$. In the embodiment illustrated in FIG. 5, the vertical depth of the implanted regions is greater than or equal to the vertical thickness of second GaN epitaxial layer 301. Thus, in some embodiments, the ion implanted region extends into the first GaN epitaxial layer by a predetermined distance. After the ion implantation process(es), an optional high-temperature anneal may be performed to activate the implanted ions and/or repair damage in the GaN material which may be introduced by the ion implantation.

Figure 6:
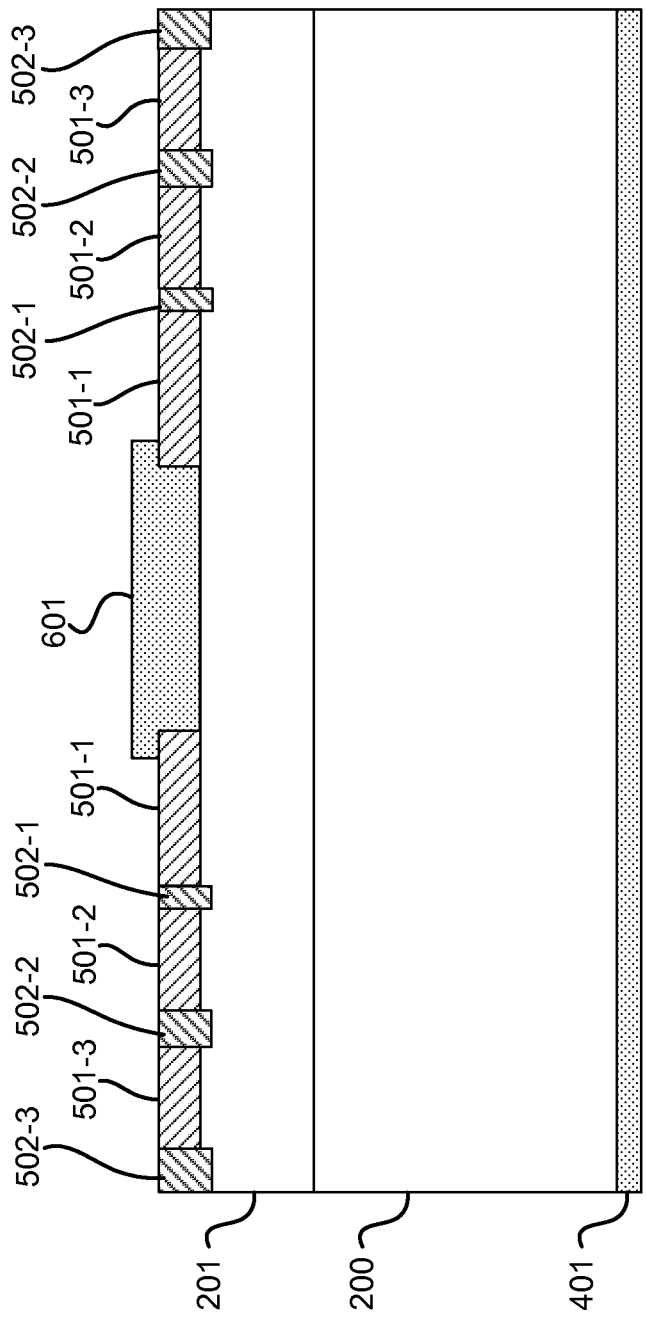

FIG. 6 illustrates the formation of a second metallic structure 601 coupled to the exposed portion 510 of the first GaN epitaxial layer 201. The second metallic structure 601 can be one or more layers of metal and/or alloys to create a Schottky barrier with the first GaN epitaxial layer 201, and the second metallic structure 601 further can overlap portions of the nearest electrically isolated region 501-1 (which may form a first element of an edge termination structure). The second metallic structure 601 can be formed using a variety of techniques, including lift-off and/or deposition with subsequent etching, which can vary depending on the metals used. In some embodiments, the contact metal structure 601 can include nickel, platinum, palladium, silver, gold, and the like.

Figure 7:
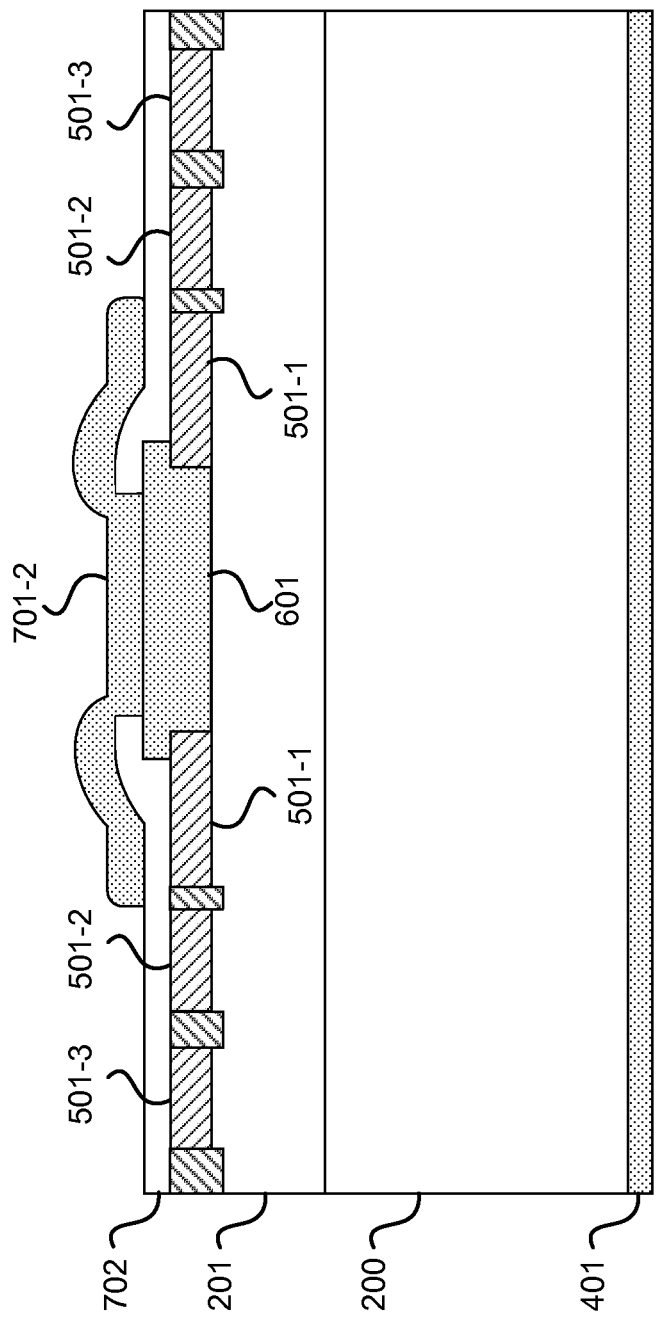

FIG. 7 illustrates the formation of metallic field plate 701-2 coupled to metallic structure 601 and to dielectric layer 702, which may also provide some passivation functionality. The metallic field plate 701-2 can be formed after dielectric layer 702 is deposited and patterned. The pattern can be formed by a controlled etch using a etch mask (not shown but patterned to expose the metallic structure 601). In alternative embodiments, the metallic field plate 701-2 can be located on or above one or multiple electrically isolated regions 501 used in forming the edge termination structures. One of ordinary skill in the art would recognize many variations, modifications, and alternatives.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIG. 2, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The fabrication process illustrated in FIGS. 2-7 utilizes a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

FIGS. 8A-10, illustrate a process for creating a PN diode in GaN with edge termination structures formed using ion implantation to isolate different regions of an epitaxial layer. The process can begin with the same steps of providing a GaN substrate 200 and a first GaN epitaxial layer 201. A second GaN epitaxial layer 301 is formed over the entire top surface of first GaN epitaxial layer 201 and a first metallic structure 401 is formed on the bottom of substrate 200, as shown in FIG. 8A. The structure properties, such as dopant concentrations and thicknesses, can vary from those of a Schottky diode, depending on the desired functionality.

Figure 8B:
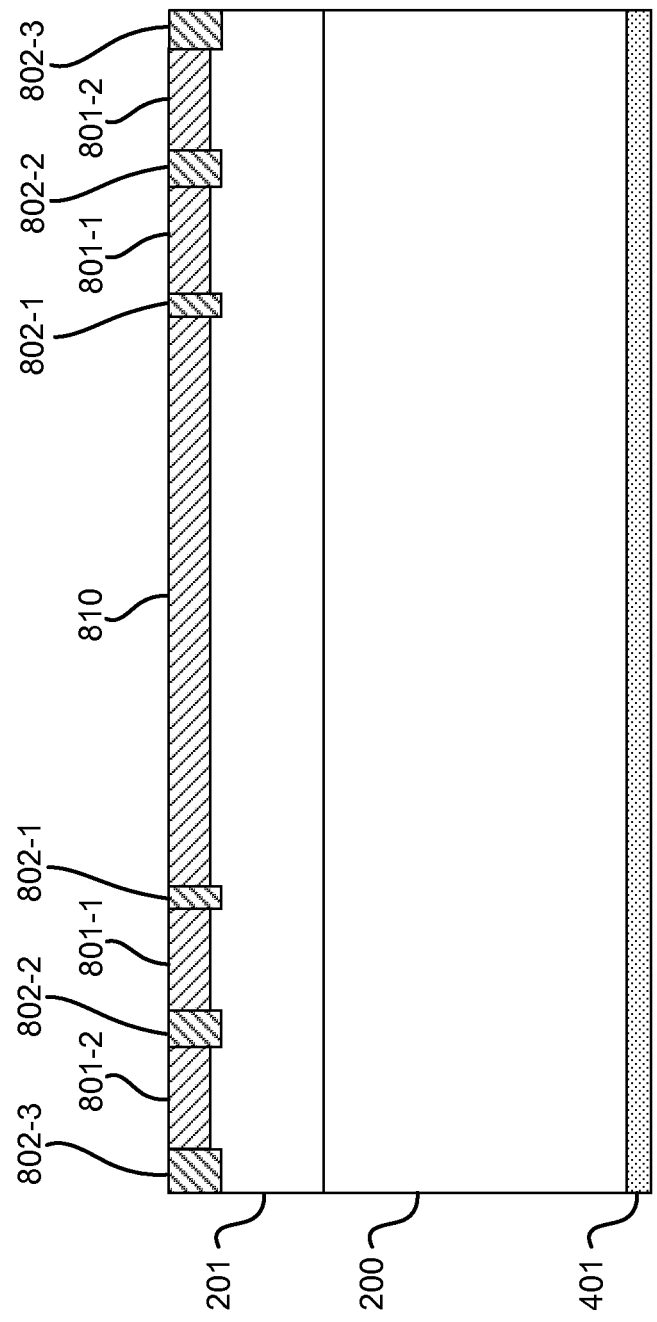
FIGS. 8A-10 are simplified cross-sectional diagrams illustrating fabrication of a PN diode in GaN with edge termination structures formed through ion implantation into an epitaxial layer according to another embodiment of the present invention.

FIG. 8B illustrates ion implantation into portions of the second GaN epitaxial layer 301 (and into portions of the first GaN epitaxial layer 201 in some embodiments) to form edge termination structures 801-1 and 801-2 configured to provide an edge termination to the PN diode that is subsequently fabricated. Additionally, as illustrated in FIG. 8B, at least a portion of the second GaN epitaxial layer 301 is left unimplanted, forming a device region 810 that is utilized in fabricating the PN diode. For example, in one embodiment, the device region 810 can have a p+ conductivity type, the first GaN epitaxial layer 201 can have a n-conductivity type, and the GaN substrate 200 can have an n+ conductivity type, forming the PN layers of the PN diode. Details of the ion implantation as discussed in reference to FIG. 5 above are applicable with respect to FIG. 8B. As discussed in relation to FIG. 5, implanted regions 802-1, 802-2, and 802-3 electrically isolate portions or regions from the second GaN epitaxial layer from other portions.

Figure 9:
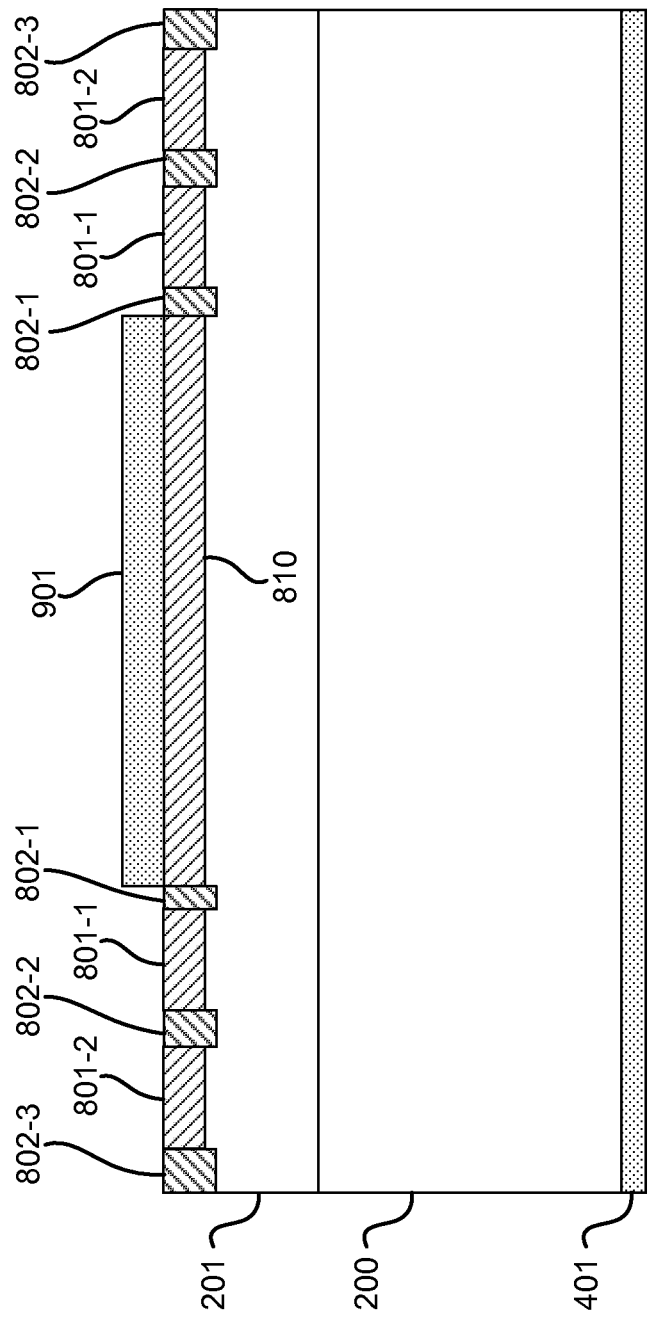

FIG. 9 illustrates the formation of a second metallic structure 901 (in addition to the metallic structure 401) electrically coupled to at least a portion of the device region 810. The second metallic structure 901 is electrically coupled to the device region 810 and can serve as an electrical contact (e.g., an anode) for the PN diode. In one embodiment, second metallic structure 901 is formed of different materials than those used to form first metallic structure 401. For example, the materials used for second metallic structure 901 may be selected to optimize the Ohmic contact to the p-type material in device region 810, while the materials used for first metallic structure 401 may be selected to optimize the Ohmic contact to GaN substrate 200. After second metallic structure 901 is formed, an optional heat treatment may be performed to improve the characteristics of the metal and/or the contact between the metal and device region 810. For example, a rapid thermal anneal may be performed with a temperature in the range of 300° C. to 900° C. for a duration of one to ten minutes. In some embodiments, the ambient environment during the RTA may include nitrogen, hydrogen, oxygen, or a combination of these gases.

While this embodiment is described in terms of a PN diode, a PIN (P-type, intrinsic, N-type) diode may be formed in a similar manner. By way of example, a PN diode may comprise N-type doping in the first GaN epitaxial layer and P-type doping in the second GaN epitaxial layer. A PIN diode, may comprise a very resistive first GaN epitaxial layer (i.e. lightly doped N-type or P-type, nearly the same resistivity as intrinsic, or undoped, GaN) and a P-type second GaN epitaxial layer.

Figure 10:
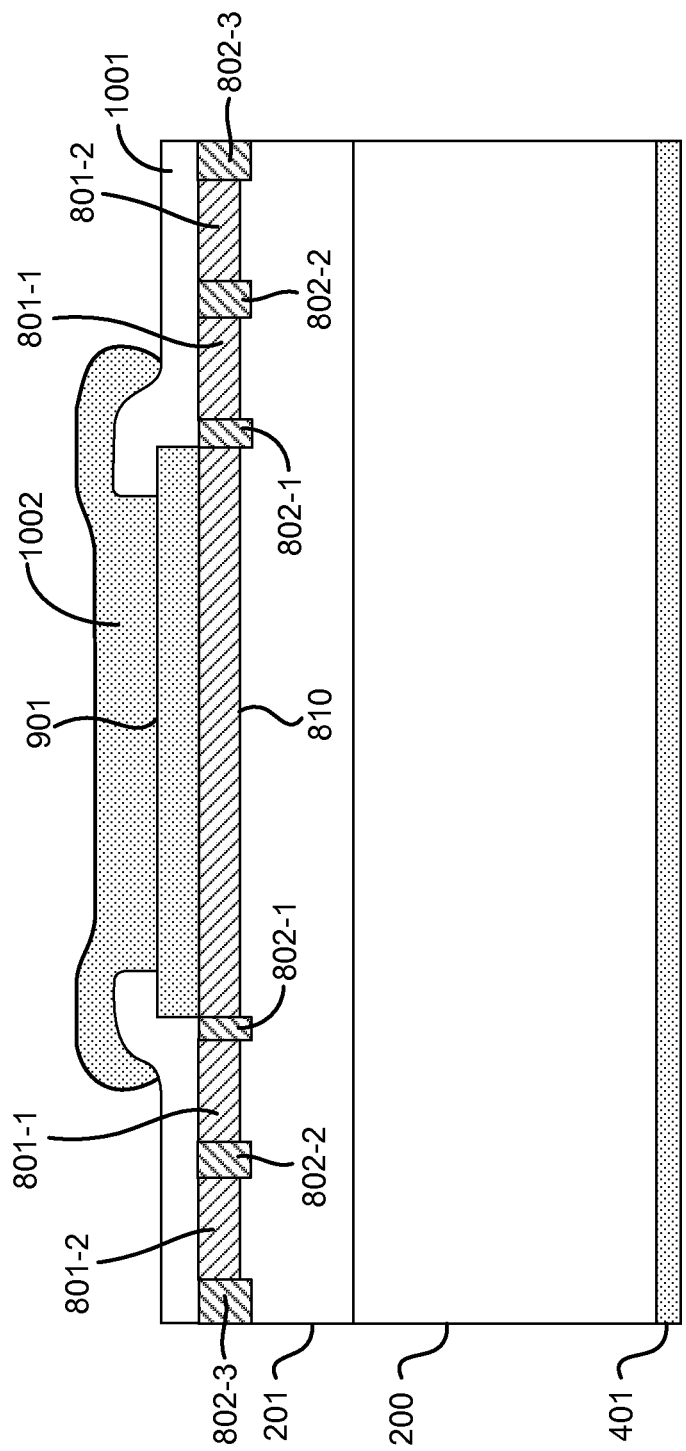

FIG. 10 illustrates the formation of metallic field plate 1002 coupled to metallic structure 901 and dielectric layer 1001. The metallic field plate 1002 can be formed after dielectric layer 1001 is deposited and patterned. The pattern can be formed by a controlled etch using a etch mask (not shown but patterned to expose the metallic structure 901). In alternative embodiments, the metallic field plate 1002 can be located on or over one or multiple edge termination structures formed using electrically isolated regions 801-1 and 801-2. One of ordinary skill in the art would recognize many variations, modifications, and alternatives.

Figure 11:
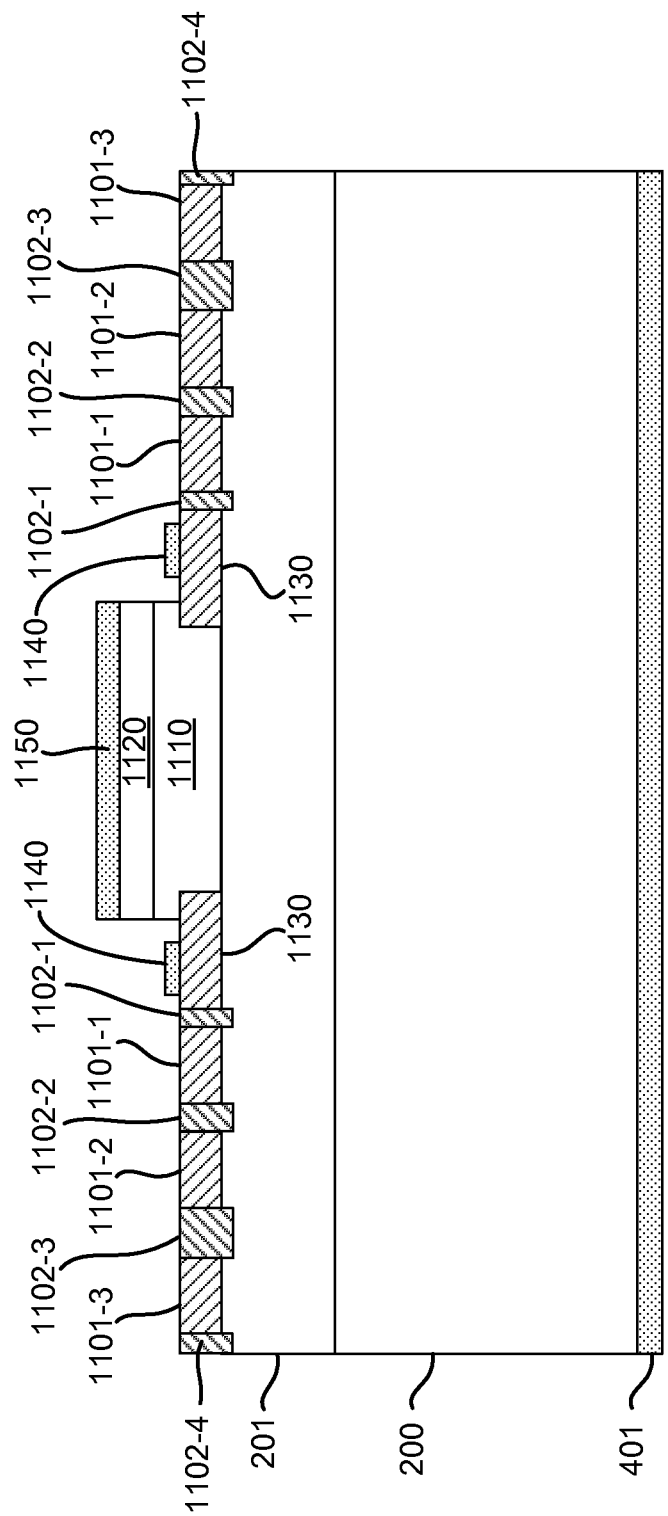
FIG. 11 is simplified cross-sectional diagram illustrating a vertical JFET with edge termination structures according to another embodiment of the present invention.

FIG. 11 is a simplified cross section of a vertical JFET with edge termination structures 1101, which can be formed using epitaxial regrowth and ion implantation, as described herein. The vertical JFET can include a GaN substrate 200, first GaN epitaxial layer 201, and first metallic structure 401, similar to those in the structures discussed previously. Here, first metallic structure 401 can function as a drain contact of the vertical JFET. Additionally, the JFET can include a channel region 1110, which can be formed through epitaxial regrowth and have a low dopant concentration similar to the first GaN epitaxial layer 201, having the same conductivity type. Furthermore, a source region 1120 can be formed from an epitaxial layer of the same conductivity type as the channel region 1110 and the first GaN epitaxial layer 201. Gate regions 1130 can be formed from the same epitaxial growth or regrowth as the edge termination structures 1101, which has an opposite conductivity type as the first GaN epitaxial layer 201. Edge termination structures 1101 are electrically isolated from each other and from gate regions 1130 by ion implanted regions 1102. Finally, Ohmic metal contacts 1140 and 1150 can be provided on the gate regions 1130 and the source region 1120 to provide gate and source contacts, respectively.

For example, in some embodiments, the GaN substrate 200 can have an n+ conductivity type with dopant concentrations ranging from $1 \times 10^{17}$ cm$^{-3}$ to $1 \times 10^{19}$ cm$^{-3}$, and the first GaN epitaxial layer 201 can have a n-conductivity type, with dopant concentrations ranging from $1 \times 10^{14}$ cm$^{-3}$ to $1 \times 10^{18}$ cm$^3$. The thickness of the first GaN epitaxial layer 201 can be anywhere from 0.5 µm and 100 µm or over 100 µm, depending on desired functionality and breakdown voltage. The channel region 1110, which can have a n-conductivity type with a dopant concentration similar to the first GaN epitaxial layer 201, can be anywhere from between 0.1 µm and 10 µm thick, and the width of the channel region 1110 (i.e., the distance between gate regions 1130) for a normally-off vertical JFET can be between 0.5 µm and 10 µm. For a normally-on vertical JFET, the width of the channel region 1110 can be greater. The source region 1120 can have a thickness of between 500 Å and 5 µm and an n-type conductivity with a dopant concentration equal to or greater than $1 \times 10^{18}$ cm$^3$. The gate regions 1130 and the edge termination structures 1101-1, 1101-2, and 1101-3 can be from 0.1 µm and 5 µm thick and have a p+ conductivity type with dopant concentrations in a range from about $1 \times 10^{17}$ cm$^{-3}$ to about $1 \times 10^{19}$ cm$^{-3}$.

Figure 12:
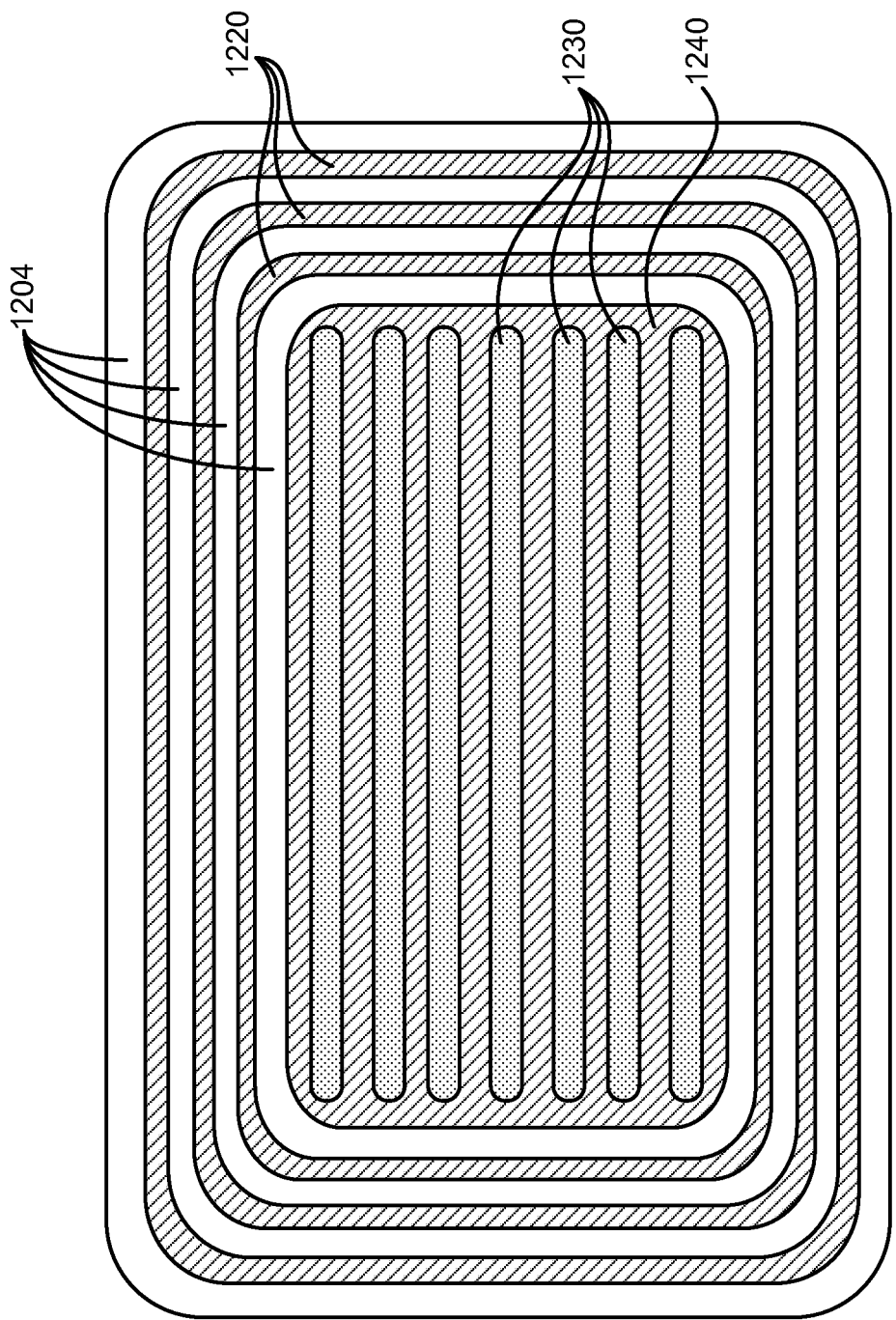
FIGS. 12-14 are simplified top-view illustrations showing different example embodiments of edge termination structures according to embodiments of the present invention.
Figure 13:
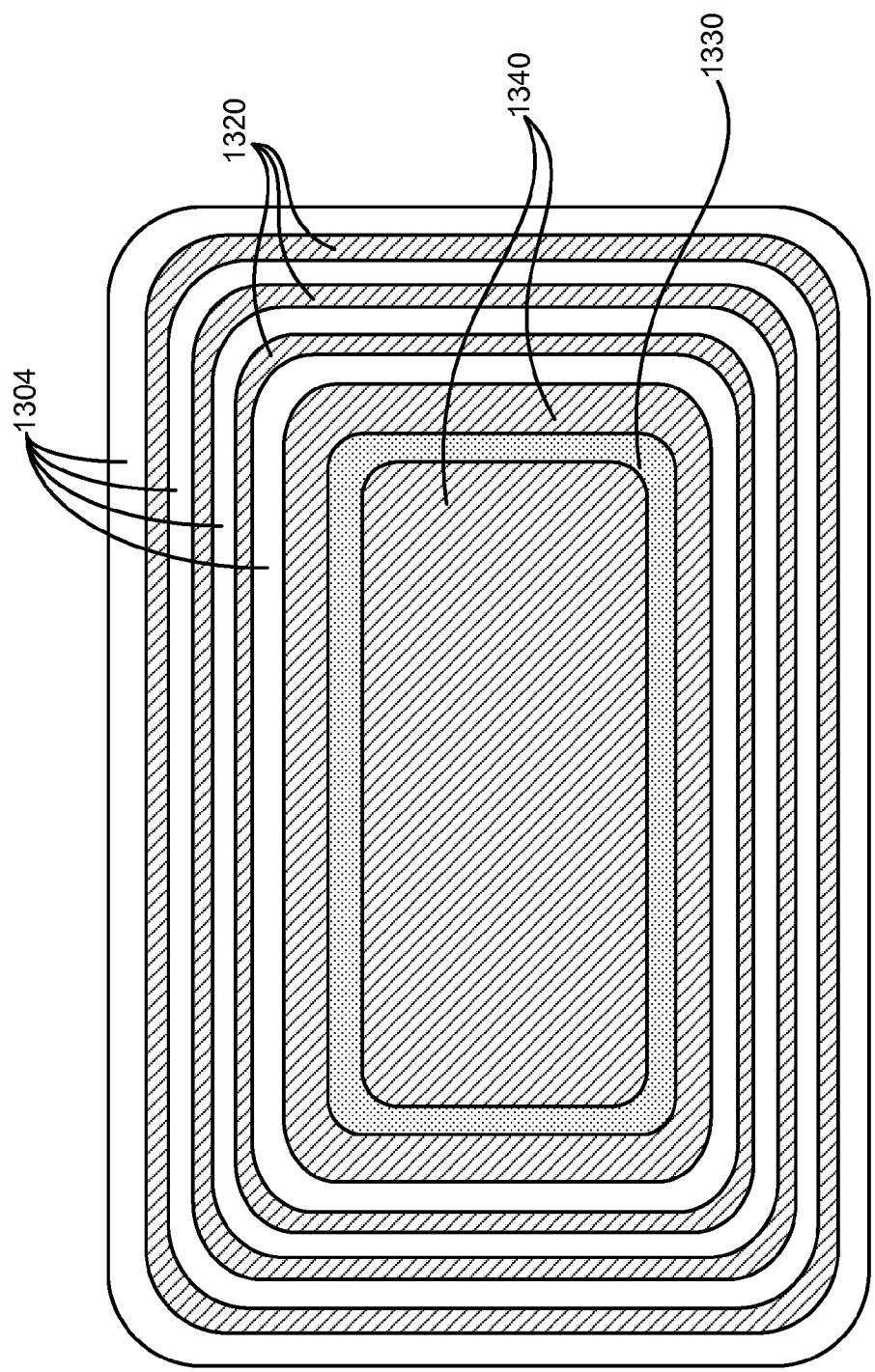
Figure 14:
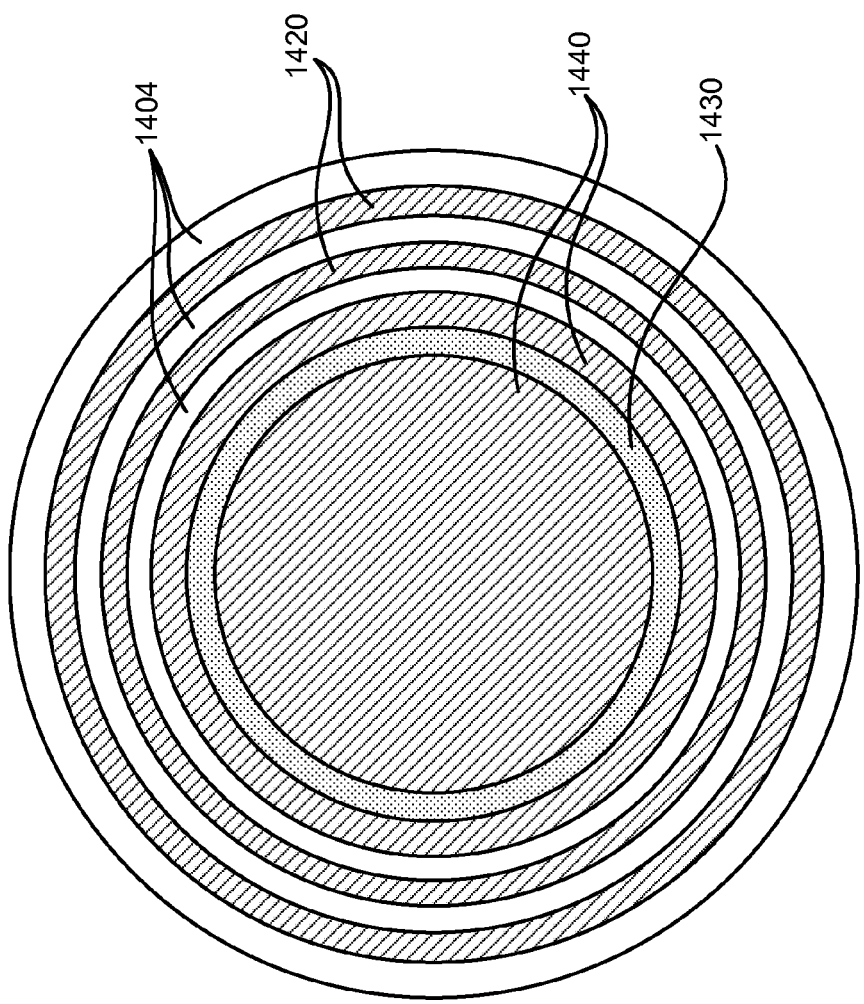

As demonstrated above, the edge termination structures described herein can provide edge termination to a variety of types of semiconductor devices. FIGS. 12-14 are simplified top-view illustrations that provide some example embodiments.

FIG. 12 illustrates a top view of an embodiment of a transistor structure with edge termination structure comprising three edge termination elements (e.g. guard rings 1220). In this embodiment, the guard rings 1220 and gate structure 1240 can be made of a p+GaN epitaxial material formed on an underlying drift region (not shown) comprising an n-GaN epitaxial layer. Multiple source regions 1230 can be made of a n+GaN epitaxial material formed on n-GaN epitaxial channel regions located between the gates. Guard rings 1220 and gate structure 1340 may comprise the same p-type epitaxial layer. Gate structure 1240 and each of the guard rings 1220 may be electrically isolated by implanted regions 1204.

FIG. 13 illustrates another embodiment of a transistor structure with edge termination provided by three guard rings 1320. Similar to the embodiment shown in FIG. 12, the guard rings 1320 and gate structure 1340 can be made of a p+GaN epitaxial material formed on an underlying drift region (not shown) comprising an n-GaN epitaxial layer. A source region 1330 can be made of a n+GaN epitaxial material formed on n-GaN epitaxial channel region located between the gates formed from the gate structure 1340. Gate structure 1340 and each of the guard rings 1320 may be electrically isolated by implanted regions 1304.

FIG. 14 illustrates yet another embodiment of a transistor structure similar to the embodiment shown in FIG. 13, illustrating how edge termination structures, such as guard rings 1420, can shaped differently to accommodate differently-shaped semiconductor structures. Again, guard rings 1420 and gate structure 1440 can be made of a p+GaN epitaxial material formed on a drift region 1410 comprising an n-GaN epitaxial layer (not shown). A source region 1430 can be made of a n+GaN epitaxial material on n-GaN epitaxial channel region located between the gates formed from the gate structure 1440. Gate structure 1440 and each of the guard rings 1420 may be electrically isolated by implanted regions 1404.

Figure 15:
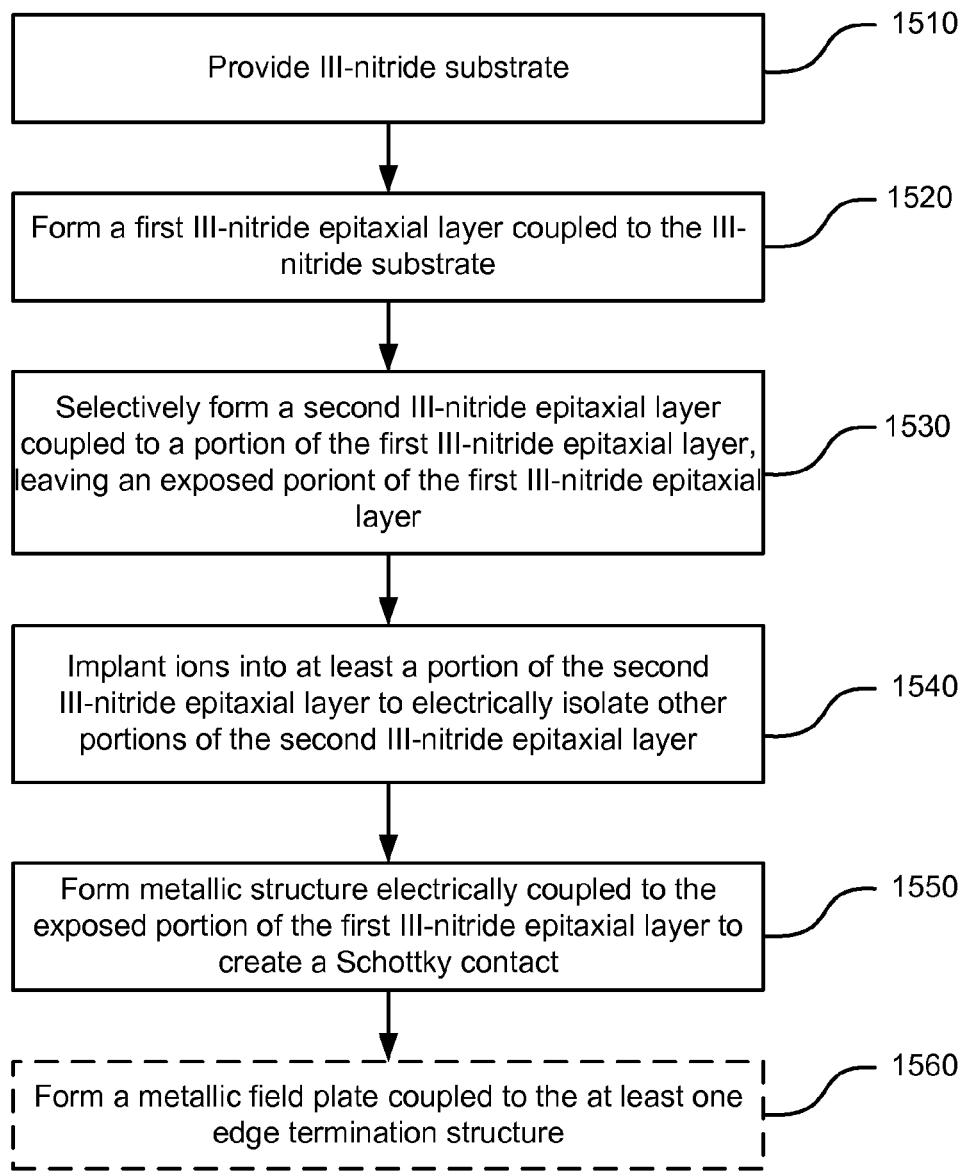
FIG. 15 is a simplified flowchart illustrating a method of fabricating a Schottky diode with edge termination structures formed through ion implantation into an epitaxial layer according to an embodiment of the present invention.

FIG. 15 is a simplified flowchart illustrating a method of fabricating a Schottky diode with edge termination structures in a III-nitride material, according to an embodiment of the present invention. Referring to FIG. 15, a III-nitride substrate is provided (1510), characterized by a first conductivity type and a first dopant concentration. In an embodiment, the III-nitride is a GaN substrate with n+ conductivity type. The method also includes forming a first III-nitride epitaxial layer (e.g., an n-type GaN epitaxial layer) coupled to the III-nitride substrate (1520). The III-nitride substrate and first III-nitride epitaxial layer are characterized by a first conductivity type, for example n-type conductivity, and the first III-nitride epitaxial layer is characterized by a second dopant concentration less than the first dopant concentration. Using the homoepitaxy techniques described herein, the thickness of the first III-nitride epitaxial layer can be thicker than available using conventional techniques, for example, between about 3 µm and about 100 µm.

The method further includes selectively forming a second III-nitride epitaxial layer coupled to the first III-nitride epitaxial layer (1530). The second III-nitride epitaxial layer (e.g., a GaN epitaxial layer of a p+ conductivity type) is characterized by a second conductivity type opposite to the first conductivity type. The second III-nitride epitaxial layer is not formed on the entire surface of the first III-nitride epitaxial layer, but only on a fraction less than one of the entire surface, thereby leaving an exposed portion of the first III-nitride epitaxial layer. The method additionally includes implanting ions into at least a portion of the second III-nitride epitaxial layer to electrically isolate other portions of the second III-nitride epitaxial layer from each other (1540). As described herein, some of the electrically isolated portions of the second III-nitride epitaxial layer are used to form at least one edge termination structure. As illustrated in FIGS. 12-14 and discussed elsewhere herein, any number between one to seven or more edge termination elements can be formed to provide edge termination for the Schottky diode or other active devices. Furthermore, the edge termination structures can be shaped any of a variety of ways, according to the physical characteristics of the Schottky diode or other active devices and other considerations.

Additionally, the method includes forming a metallic structure electrically coupled to the first III-nitride epitaxial layer to create a Schottky contact (1550) between the metallic structure and the first III-nitride epitaxial layer, which forms the drift layer. The metallic structure further can be deposited and patterned to overlap the first (i.e., closest) edge termination structures. An optional metallic field plate coupled to at least one termination structure (1560) is provided to alter or enhance edge termination, depending on desired functionality. Moreover, as illustrated in FIG. 7, a backside Ohmic metal can formed on a first surface of the III-nitride substrate opposing a surface of the III-nitride substrate coupled with the first III-nitride epitaxial layer, providing a cathode for the Schottky diode. The various epitaxial layers used to form the Schottky diode and edge termination structures do not have to be uniform in dopant concentration as a function of thickness, but may utilize varying doping profiles as appropriate to the particular application.

It should be appreciated that the specific steps illustrated in FIG. 15 provide a particular method of fabricating a Schottky diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 16:
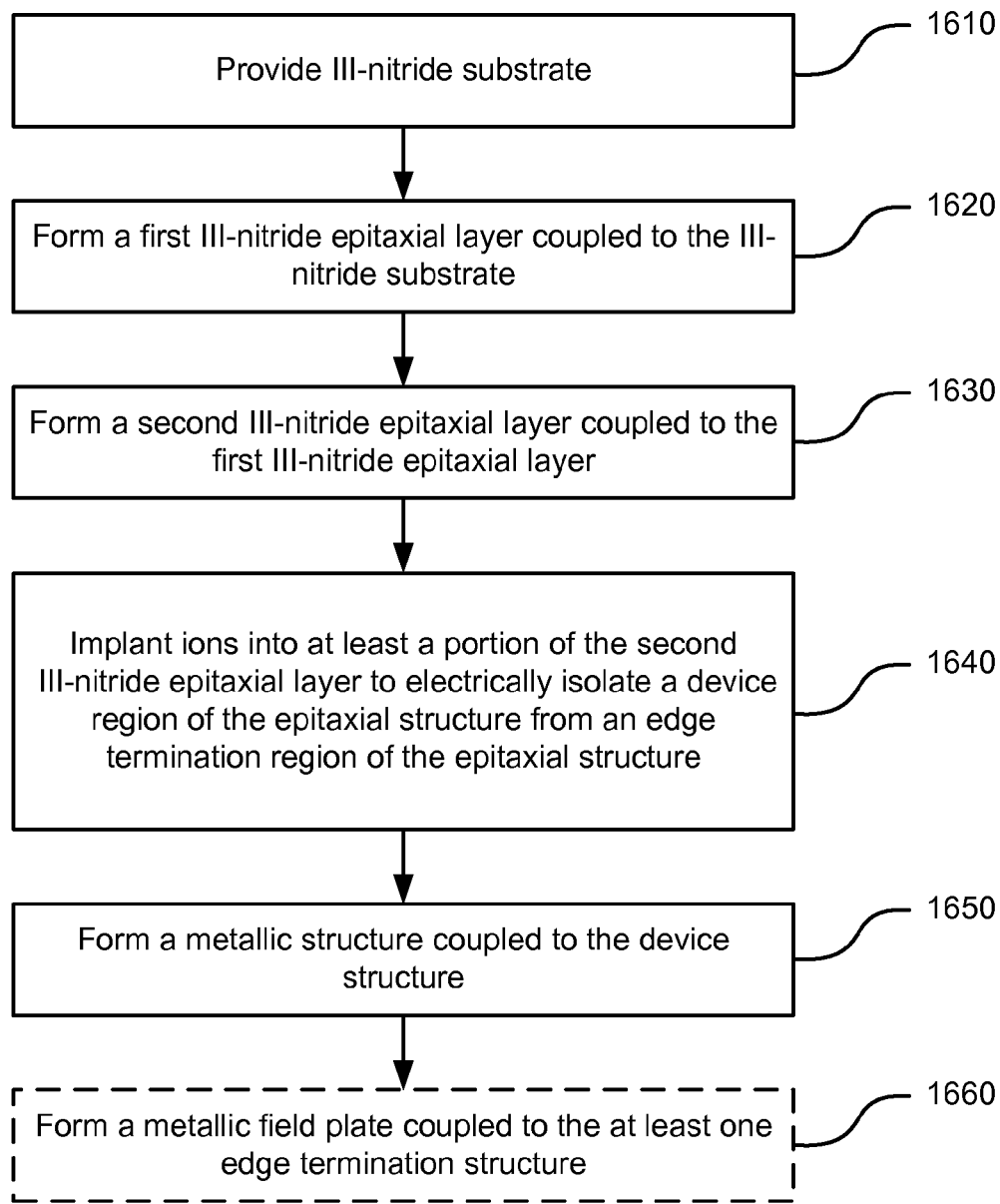
FIG. 16 is a simplified flowchart illustrating a method of fabricating a PN diode with edge termination structures formed through ion implantation into an epitaxial layer according to an embodiment of the present invention.

FIG. 16 is a simplified flowchart illustrating a method of fabricating a PIN or PN diode with edge termination structures in a III-nitride material, according to an embodiment of the present invention. Similar to the method illustrated in FIG. 15, a III-nitride substrate is provided (1610), having a first conductivity type and a first dopant concentration. The method also includes forming a first III-nitride epitaxial layer (e.g., an n-type GaN epitaxial layer) coupled to the III-nitride substrate (1620). In one embodiment, the first III-nitride epitaxial layer can be doped in a manner similar to the Schottky diode of FIG. 15, to make a PN diode. In another embodiment, the first III-nitride epitaxial layer can be an intrinsic or very lightly doped layer to function as the intrinsic region of a PIN diode.

The method further includes forming a second III-nitride epitaxial layer coupled to the first III-nitride epitaxial layer (1630). The second III-nitride epitaxial layer (e.g., a GaN epitaxial layer of a p+ conductivity type) is characterized by a second conductivity type. Depending on the conductivity type of the second III-nitride epitaxial layer, the device structure forms the P or N region of the PN diode. The substrate and epitaxial layers discussed herein can be referred to as an epitaxial structure.

The method additionally includes implanting ions into at least a portion of the second III-nitride epitaxial layer to electrically isolate a device region of the epitaxial structure from an edge termination region of the epitaxial structure (1640). One or more active devices can be fabricated in the device region and one or more edge termination structures can be fabricated in the edge termination region. Thus, using embodiments of the present invention, one or more active devices can be formed using at least the device region of the epitaxial structure and an edge termination structure can be formed using at least the edge termination region of the epitaxial structure.

The method includes forming a metallic structure electrically coupled to the device structure (1650) to create an Ohmic metal contact of the PN diode. Additionally, a metallic field plate can be coupled to at least one termination structure (1660) to alter or enhance edge termination, depending on desired functionality. Moreover, similar to the method for creating the Schottky diode, the method can include forming a backside Ohmic metal coupled to the III-nitride substrate. The various epitaxial layers used to form the PN diode and edge termination structures do not have to be uniform in dopant concentration as a function of thickness, but may utilize varying doping profiles as appropriate to the particular application.

It should be appreciated that the specific steps illustrated in FIG. 16 provide a particular method of fabricating a PN diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

As illustrated herein, edge termination structures can be provided in any of a variety of shapes and forms, depending on physical features of the semiconductor device for which the edge termination structures provide edge termination. For instance, in certain embodiments, edge termination structures may not circumscribe the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an edge termination structure, the method comprising:
   providing a substrate of a first conductivity type, the substrate having a first surface and a second surface;
   forming a first GaN epitaxial layer of the first conductivity type coupled to the first surface of the substrate;
   forming a second GaN epitaxial layer of a second conductivity type opposite to the first conductivity type, the second GaN epitaxial layer being coupled to the first GaN epitaxial layer;
   implanting ions into a first region of the second GaN epitaxial layer to electrically isolate a second region of the second GaN epitaxial layer from a third region of the second GaN epitaxial layer; and
   forming an active device coupled to the second region of the second GaN epitaxial layer;
   wherein the third region of the second GaN epitaxial layer comprises an edge termination structure.

2. The method of claim 1 further comprising forming a first metallic structure electrically coupled to the second surface of the substrate.

3. The method of claim 2 further comprising forming a second metallic structure electrically coupled to a portion of the second region of the second GaN epitaxial layer, wherein the second metallic structure comprises an Ohmic contact to the portion of the second region of the second GaN epitaxial layer.

4. The method of claim 3 wherein the second metallic structure is further electrically coupled to the edge termination structure.

5. The method of claim 4 wherein forming the first metallic structure is performed before forming the second metallic structure.

6. The method of claim 1 wherein the substrate is characterized by a first n-type dopant concentration, the first GaN epitaxial layer is characterized by a second n-type dopant concentration less than the first n-type dopant concentration, and the second GaN epitaxial layer is characterized by a p-type dopant concentration greater than the second n-type dopant concentration and less than the first n-type dopant concentration.

7. The method of claim 1 further comprising forming a metallic structure electrically coupled to a portion of the first GaN epitaxial layer, wherein the metallic structure comprises a Schottky contact to the portion of the first GaN epitaxial layer.

8. The method of claim 7 further comprising:
   forming a dielectric layer coupled to the edge termination structure and the metallic structure;

removing a portion of the dielectric layer to expose a portion of the metallic structure; and forming a field plate coupled to the exposed portion of the metallic structure.

9. The method of claim 1 further comprising forming a metallic field plate coupled to the edge termination structure.

10. The method of claim 1 wherein the edge termination structure circumscribes the active device.

11. A method of fabricating a vertical power device structure, the method comprising:
  forming an epitaxial structure by:
    providing a III-nitride substrate of a first conductivity type characterized by a first dopant concentration;
    forming a first III-nitride epitaxial layer of the first conductivity type coupled to a first surface of the III-nitride substrate; and
    forming a second III-nitride epitaxial layer of a second conductivity type coupled to the first III-nitride epitaxial layer, wherein the second III-nitride epitaxial layer has a surface opposing the first III-nitride epitaxial layer;
  defining regions of the epitaxial structure by implanting ions into the surface of the second epitaxial layer to form an implantation region of the epitaxial structure, wherein the implantation region electrically isolates a device region of the epitaxial structure from an edge termination region of the epitaxial structure;
  forming one or more active devices using at least the device region of the epitaxial structure; and
  forming an edge termination structure using at least the edge termination region of the epitaxial structure.

12. The method of claim 11 further comprising forming a Schottky metallic structure coupled to the first epitaxial layer.

13. The method of claim 12 wherein the metallic structure is further coupled to the edge termination structure.

14. The method of claim 11 further comprising forming a metallic field plate coupled to the edge termination structure.

15. The method of claim 11 wherein the edge termination structure circumscribes the one or more active devices.

16. The method of claim 11 wherein the first III-nitride epitaxial layer is characterized by a second dopant concentration less than the first dopant concentration.

17. The method of claim 11 wherein forming the edge termination structure comprises forming three or more edge termination elements with predetermined spaces between each of the three or more edge termination elements, wherein:
  a first spacing of the predetermined spaces is located closer to the one or more active devices than a second spacing of the predetermined spaces; and
  a width of the first spacing is smaller than a width of the second spacing.

* * * * *